United States Patent [19]

Tsai

[11] Patent Number: 5,616,044
[45] Date of Patent: Apr. 1, 1997

[54] ZERO INSERT-FORCE INTEGRATED CIRCUIT SOCKET ASSEMBLY AND CONDUCTIVE TERMINAL PIN THEREFOR

[76] Inventor: Chou-Hsuan Tsai, 4-4Fl., No. 8, Lane 609, Sec. 5, Chung-Hsig Rd., Sanchung City, Taipei Hsien, Taiwan

[21] Appl. No.: 485,822

[22] Filed: Jun. 6, 1995

[51] Int. Cl.⁶ .................................................. H01R 4/50
[52] U.S. Cl. ............................................... 439/342
[58] Field of Search ................................ 439/342, 259, 439/856, 857

[56] References Cited

U.S. PATENT DOCUMENTS

| | | | |
|---|---|---|---|
| 4,449,773 | 5/1984 | Esser et al. | 439/259 |
| 4,531,792 | 7/1985 | Oshitani et al. | 439/342 |
| 5,454,727 | 10/1995 | Hsu | 439/342 |

Primary Examiner—Neil Abrams
Assistant Examiner—Yong Kim
Attorney, Agent, or Firm—Lynn & Lynn

[57] ABSTRACT

A conductive terminal pin for a zero-insert force integrated circuit socket assembly has an upper part with a back portion and a curved contact portion, and a lower part that serves as a mounting leg. The contact portion includes a pair of elongated contact arms that are connected spacedly to a bottom edge of the back portion. Each of the contact arms has a first segment that extends substantially horizontally from the back portion, a second segment that extends upwardly from a distal end of the first segment, and a third segment that extends substantially horizontally from a distal end of the second segment toward the back portion. The contact arms define therebetween a pin receiving channel with a wider insert portion that extends between a portion of the third segments of the contact arms adjacent to the second segments, and a narrower retaining portion that extends between a portion of the third segments of the contact arms adjacent to the back portion. The lower part extends downwardly from the bottom edge of the back portion and is disposed between the contact arms.

18 Claims, 9 Drawing Sheets

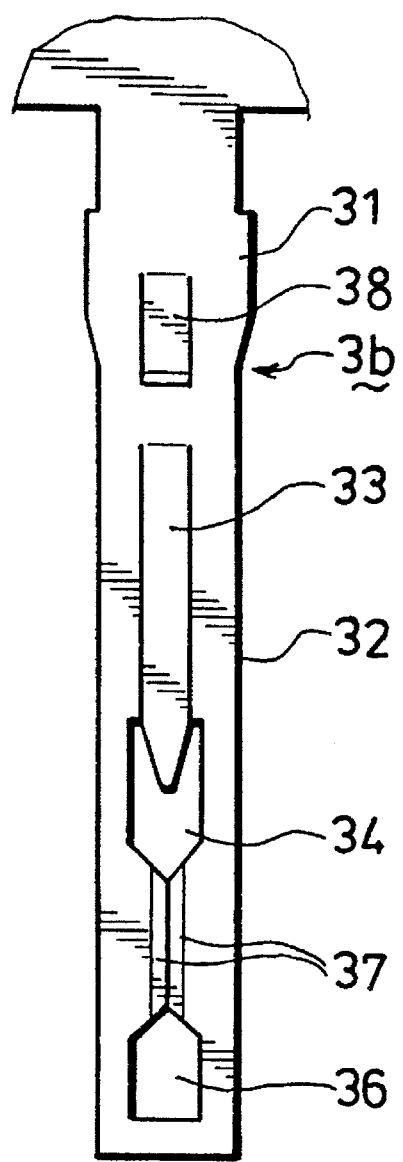
F I G. 10

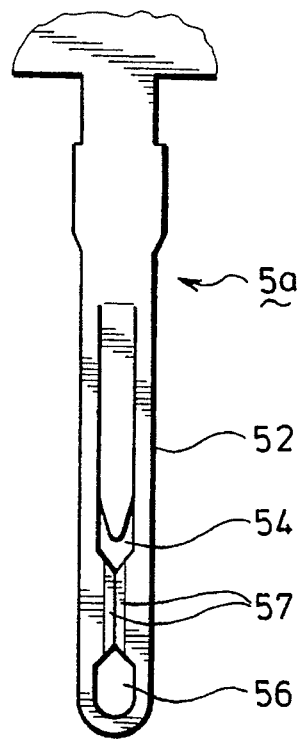
F I G. 15
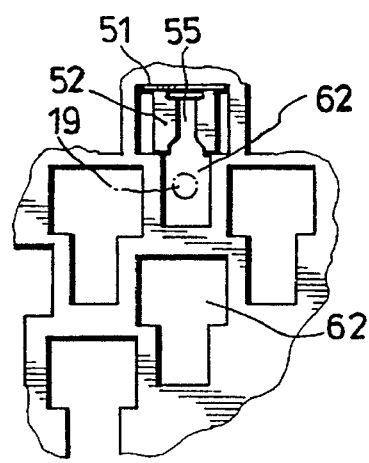
F I G. 16

ZERO INSERT-FORCE INTEGRATED CIRCUIT SOCKET ASSEMBLY AND CONDUCTIVE TERMINAL PIN THEREFOR

BACKGROUND OF THE INVENTION

1. Field of the Invention

The invention relates to an integrated circuit socket assembly, more particularly to a zero insert-force integrated circuit socket assembly and to a conductive terminal pin therefor.

2. Description of the Related Art

Referring to FIG. 1, a conventional socket assembly for an integrated circuit, such as a central processing unit (CPU), is shown to comprise a chip mounting plate 11, a base body 12 and an actuating lever 13. The base body 12 is formed with a plurality of terminal holes 121 that receive a respective conductive terminal pin 14 therein. The chip mounting plate 11 is mounted slidably on the base body 12 and is formed with a plurality of through-holes 111 which permit extension of the pins of the integrated circuit (not shown) into a respective one of the terminal holes 121 in the base body 12. The actuating lever 13 is associated operably with the chip mounting plate 11 and the base body 12 and is operable so as to move the chip mounting plate 11 slidably on the base body 12 to make or break electrical connection between the pins of the integrated circuit and the conductive terminal pins 14 in the terminal holes 121. The actuating lever 13 is a generally L-shaped member with a first portion 131 that is operable manually to rotate the actuating lever 13, and a second portion 133 that is transverse to the first portion 131 and that is received pivotally in a pivot groove 122 formed in a top surface of the base body 12. The second portion 133 of the actuating lever 13 has a cam section 132 which engages a retaining groove 112 that is formed in a bottom surface of the chip mounting plate 11.

Referring to FIG. 2, each conductive terminal pin 14 includes a flat intermediate portion 141, a vertical head portion 143 having a lower end connected to the flat intermediate portion 141 by a bend 142, a contact portion 145 connected transversely to an upper end of the vertical head portion 143 by a bend 144, and a vertical mounting leg portion 146 extending downwardly from the flat intermediate portion 141.

Referring once more to FIG. 1, the conductive terminal pins 14 are mass-produced in the form of a stamped metal sheet. A connecting belt 15 interconnects the distal top ends of the conductive terminal pins 14 such that the distance between two adjacent conductive terminal pins 14 is about 2.54 mm, which is the distance between adjacent pins of the CPU, thereby facilitating the mounting of one row of conductive terminal pins 14 in the terminal holes 121 of the base body 12. The connecting belt 15 is torn off once the conductive terminal pins 14 have been mounted in the base body 12.

Referring to FIGS. 1 and 3, when the pins 18 of the integrated circuit are extended into the terminal holes 121 of the base body 12, the pins 18 are disposed initially between the vertical head portion 143 of the respective conductive terminal pin 14 and one of the side walls which confine the respective terminal hole 121. Since the conductive terminal pins 14 do not contact the pins 18 at this time, no resistance is encountered when the pins 18 are extended into the terminal holes 121. When the actuating lever 13 is operated so as to move the chip mounting plate 11 slidably on the base body 12, the pins 18 are moved toward the contact portion 145 of the respective conductive terminal pin 14 to establish electrical connection therewith. The contact portion 145 of the conductive terminal pins 14 press tightly the corresponding pin 18 toward one of the side walls which confine the respective terminal hole 121 to mount securely the integrated circuit to the base body 12.

It is noted that the aforementioned conventional conductive terminal pin 14 has a simple structure and can be conveniently mounted in the base body 12 of the socket assembly. However, the conductive terminal pins 14 are not mounted securely in the base body 12 since the former rely solely on the engagement between a diverging top end 147 of the vertical mounting leg portion 146 and the base body 12 to retain the same in the terminal holes 121.

FIG. 4 illustrates another conventional conductive terminal pin for a zero-insert force integrated circuit socket assembly. As shown, the conductive terminal pin 2 is similarly made from a stamped metal sheet and includes a contact portion 22 formed on a top end of a mounting leg portion 21. The contact portion 22 defines an upright pin receiving channel with an outer, wider channel section 201 and an inner, narrower channel section 202 communicated with the wider channel section 201.

The conventional conductive terminal pin 2 shown in FIG. 4 is capable of providing a greater pin retaining force than the conventional conductive terminal pin 14 shown in FIG. 2. However, since the total width of the conductive terminal pin 2 prior to bending of the stamped metal sheet (not shown) exceeds the standard 2.54 mm distance between adjacent pins of the CPU, one row of terminal holes in the base body of the integrated circuit socket assembly cannot be filled with the conductive terminal pins 2 in a single mounting operation, thereby inconveniencing the manufacture of the socket assembly. In addition, as with the conventional conductive terminal pin 14, the conductive terminal pins 2 are not mounted securely in the base body of the socket assembly since the former also rely solely on the engagement between a diverging top end 25 of the mounting leg portion 21 and the base body to retain the same in the terminal holes.

SUMMARY OF THE INVENTION

Therefore, the object of the present invention is to provide a zero-insert force integrated circuit socket assembly with improved conductive terminal pins which can overcome the drawbacks that are commonly associated with the aforementioned prior art.

More specifically, the object of the present invention is to provide a zero-insert force integrated circuit socket assembly with improved conductive terminal pins that can be mounted conveniently and securely to a base body of the socket assembly.

According to one aspect of the present invention, a zero-insert force socket assembly for an integrated circuit includes a base body that is formed with a plurality of terminal holes, a plurality of conductive terminal pins that are received respectively in the terminal holes, a chip mounting plate mounted slidably on the base body and formed with a plurality of through-holes which permit extension of pins of the integrated circuit into a respective one of the terminal holes, and an actuating lever associated operably with the chip mounting plate and the base body and operable so as to move the chip mounting plate slidably on the base body to make or break electrical connection between the pins of the integrated circuit and the conductive terminal pins in the terminal holes.

Each of the conductive terminal pins includes an upper part with a back portion and a curved contact portion, and a lower part that serves as a mounting leg. The contact portion includes a pair of elongated contact arms that are connected spacedly to a bottom edge of the back portion. Each of the contact arms has a first segment that extends substantially horizontally from the back portion, a second segment that extends upwardly from a distal end of the first segment, and a third segment that extends substantially horizontally from a distal end of the second segment toward the back portion. The contact arms define therebetween a pin receiving channel with an insert portion that extends between a portion of the third segments of the contact arms adjacent to the second segments, and a retaining portion that extends between a portion of the third segments of the contact arms adjacent to the back portion. The insert portion is wider than the pins of the integrated circuit, while the retaining portion is narrower than the pins of the integrated circuit. The lower part extends downwardly from the bottom edge of the back portion and is disposed between the contact arms.

According to another aspect of the present invention, a conductive terminal pin for a zero-insert force integrated circuit socket assembly is to be received in a respective terminal hole formed in a base body of the socket assembly and comprises an upper part with a back portion and a curved contact portion, and a lower part that serves as a mounting leg. The contact portion includes a pair of elongated contact arms that are connected spacedly to a bottom edge of the back portion. Each of the contact arms has a first segment that extends substantially horizontally from the back portion, a second segment that extends upwardly from a distal end of the first segment, and a third segment that extends substantially horizontally from a distal end of the second segment toward the back portion. The contact arms define therebetween a pin receiving channel with an insert portion that extends between a portion of the third segments of the contact arms adjacent to the second segments, and a retaining portion that extends between a portion of the third segments of the contact arms adjacent to the back portion. The insert portion is wider than pins of an integrated circuit that is to be mounted on the socket assembly, while the retaining portion is narrower than the pins of the integrated circuit. The lower part extends downwardly from the bottom edge of the back portion and is disposed between the contact arms.

BRIEF DESCRIPTION OF THE DRAWINGS

Other features and advantages of the present invention will become apparent in the following detailed description of the preferred embodiments with reference to the accompanying drawings, of which:

FIG. 10 is a fragmentary schematic view of a stamped metal sheet used in forming a conductive terminal pin of the second preferred embodiment of a zero insert-force integrated circuit socket assembly according to the present invention;

FIG. 15 is a fragmentary schematic view of a stamped metal sheet used in forming the conductive terminal pin of the fourth preferred embodiment; and FIG. 16 is a top view illustrating how the conductive terminal pin of the fourth preferred embodiment retains a pin of a high-density integrated circuit in a terminal hole of a base body of the integrated circuit socket assembly.

DETAILED DESCRIPTION OF THE PREFERRED EMBODIMENTS

Figure 1:
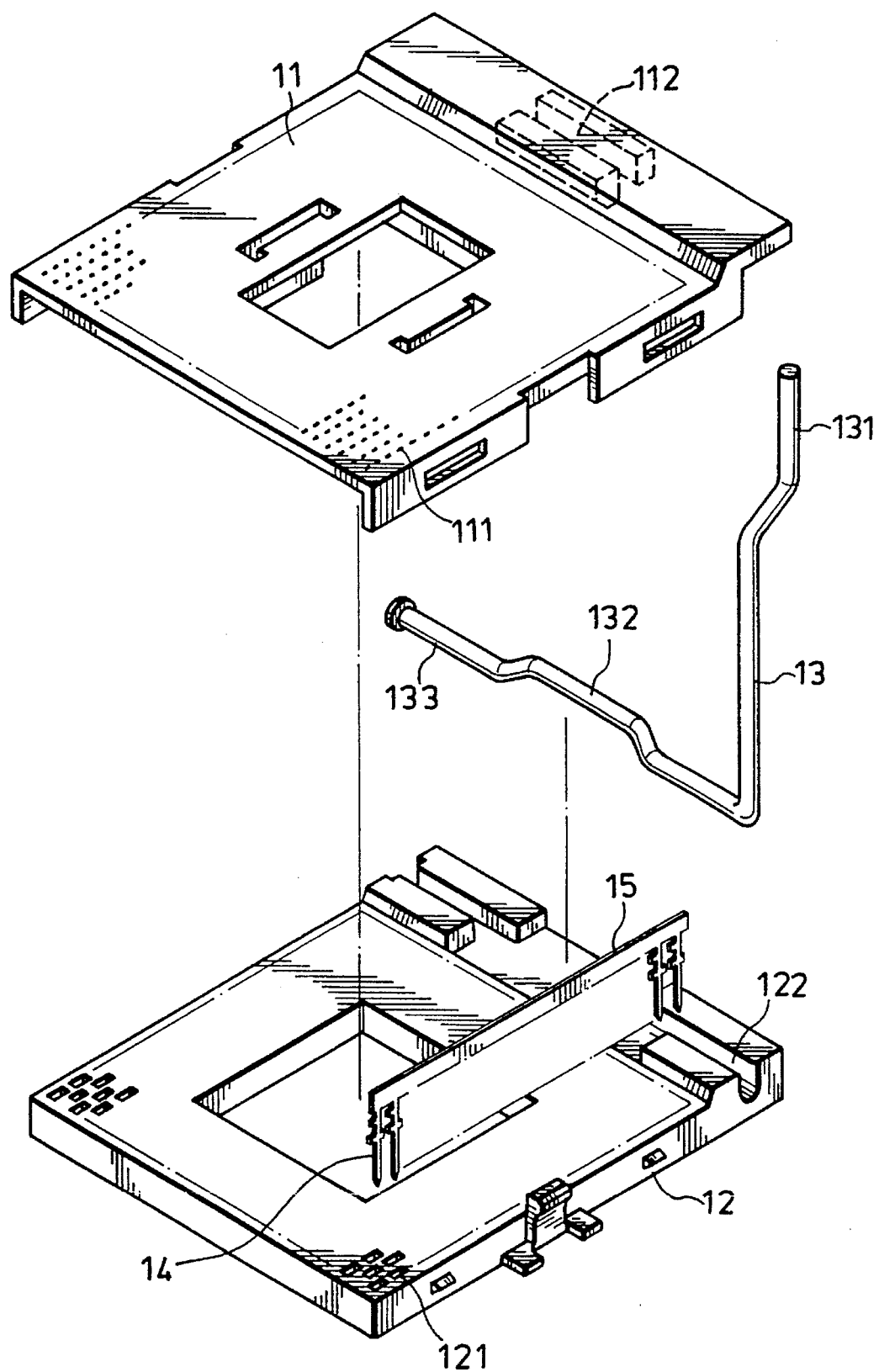
FIG. 1 is an exploded view of a conventional integrated circuit socket assembly.
Figure 2:
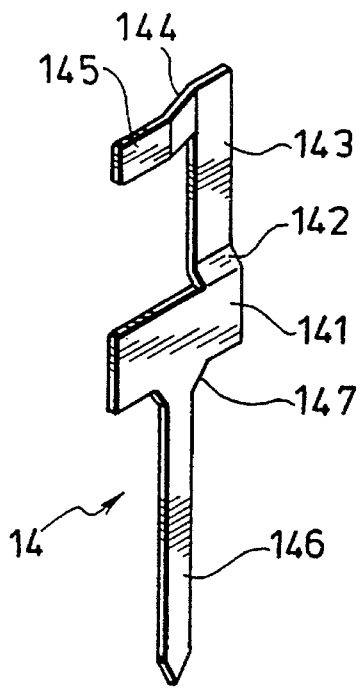
FIG. 2 is a perspective view of a conductive terminal pin for the conventional integrated circuit socket assembly.
Figure 3:
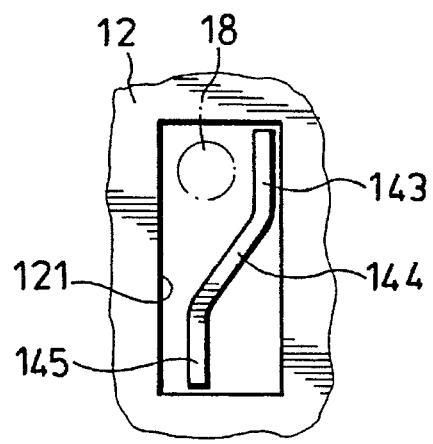
FIG. 3 is a schematic view illustrating how the conductive terminal pin shown in FIG. 2 retains a pin of an integrated circuit in a terminal hole of a base body of the conventional integrated circuit socket assembly.
Figure 4:
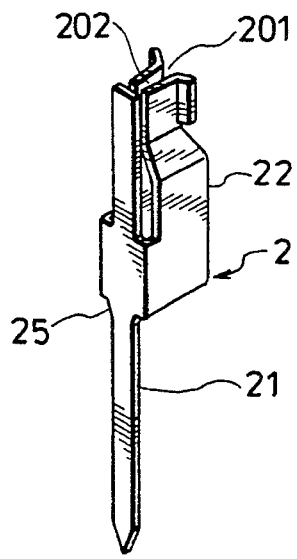
FIG. 4 is a perspective view of another conductive terminal pin for the conventional integrated circuit socket assembly.

Before the present invention is described in greater detail, it should be noted that like elements are denoted by the same reference numerals in the following disclosure.

Figure 5:
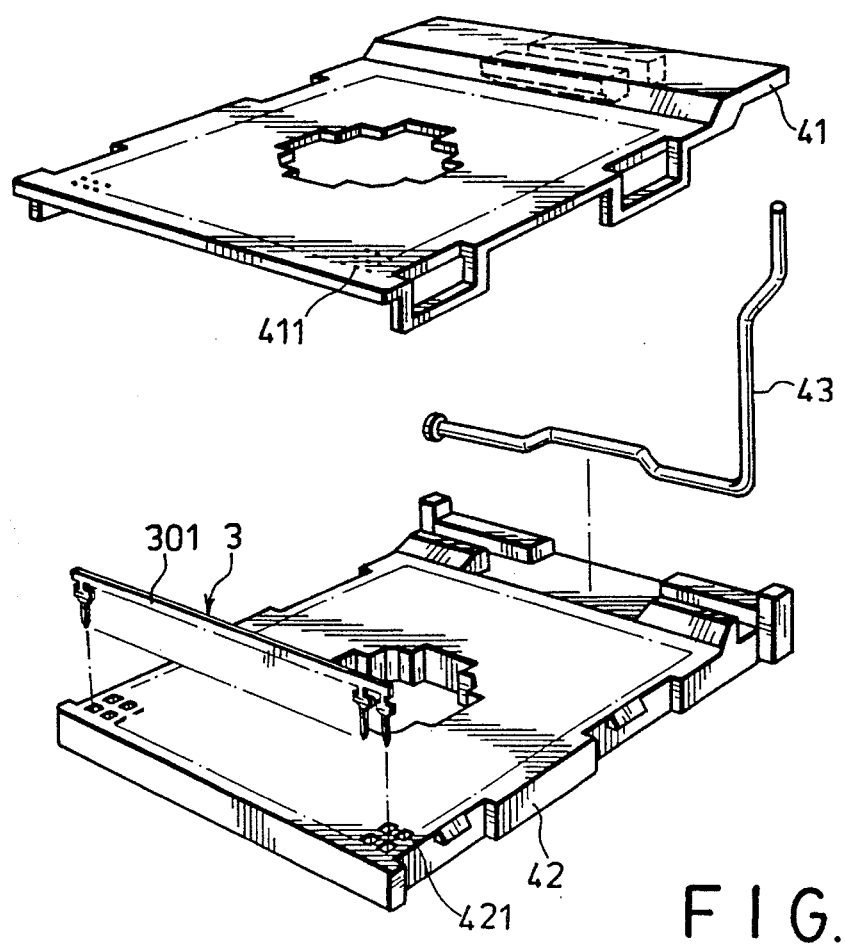
FIG. 5 is an exploded view of the first preferred embodiment of a zero insert-force integrated circuit socket assembly according to the present invention.

Referring to FIG. 5, the zero-insert force integrated circuit socket assembly of the present invention is shown to comprise a chip mounting plate 41, a base body 42 and an actuating lever 43. The base body 42 is formed with a plurality of terminal holes 421 that receive a respective conductive terminal pin 3 therein. The chip mounting plate 41 is mounted slidably on the base body 42 in a known manner and is formed with a plurality of through-holes 411 which permit extension of the pins of an integrated circuit (not shown) into a respective one of the terminal holes 421 in the base body 42. The actuating lever 43 is associated operably with the chip mounting plate 41 and the base body 42 and is operable so as to move the chip mounting plate 41 slidably on the base body 42 in a known manner to make or break electrical connection between the pins of the integrated circuit and the conductive terminal pins 3 in the terminal holes 421.

Figure 6:
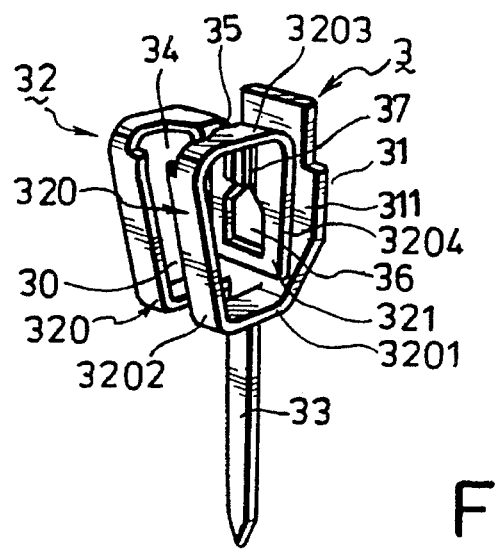
FIG. 6 is a perspective view of a conductive terminal pin for the first preferred embodiment.

Referring to FIG. 6, the conductive terminal pin 3 is shown to comprise an upper part with a back portion 31 and a curved contact portion 32, and a lower part 33 that serves as a mounting leg for mounting the socket assembly on a printed circuit board. The back portion 31 has a flat intermediate section 311 which is slightly wider than the terminal holes 421 in the base body 42 (see FIG. 5) to secure tightly the conductive terminal pin 3 in the base body 42. Preferably, the width of the intermediate section 311 is about 1.96 mm, while that of the terminal holes 421 is about 1.9 mm. The contact portion 32 includes a pair of elongated contact arms 320 that are connected spacedly to a bottom edge of the back portion 31. Each of the contact arms 320 has a first segment 3201 that extends substantially horizontally from the back portion 31, a second segment 3202 that extends upwardly from a distal end of the first segment 3201, a third segment 3203 that extends substantially horizontally from a distal end of the second segment 3202 toward the back portion 31, and a fourth segment 3204 that extends downwardly from a distal end of the third segment 3203. The contact arms 320 define therebetween a pin receiving channel 30 with an insert portion 34 that extends between a portion of the third segments 3203 of the contact arms 320 adjacent to the second segments 3202, and a retaining portion 35 that extends between a portion of the third segments 3203 of the contact arms 320 adjacent to the back portion 31 and that extends further between the fourth segments 3204 of the contact arms 320. The insert portion 34 is wider than a pin of an integrated circuit, such as a central processing unit (CPU), while the retaining portion 35 is narrower than the pin of the integrated circuit. Since the pin of the CPU has a width of about 0.5 mm, the width of the insert portion 34 is preferably about 0.7 to 0.8 mm, while the width of the retaining portion 35 is preferably about 0.35 to 0.4 mm. The fourth segments 3204 of the contact arms 320 have distal ends that are interconnected by a connecting strip 321. The connecting strip 321 is formed with a notch 36 that is wider than the retaining portion 35. Preferably, the notch 36 is wider than the pins of the integrated circuit. The contact portion 32 further includes a pair of clamping flanges 37 formed respectively on the contact arms 320 on two sides of the retaining portion 35 to prevent the conductive terminal pin 3 from damaging the pins of the integrated circuit.

The lower part 33 extends vertically downward from the bottom edge of the back portion 31 and is disposed between the contact arms 320. Preferably, the space between the contact arms 320 at the bottom edge of the back portion 31 is about 0.6 mm and is equal to the width of the lower part 33. Thus, the lower part 33 is slightly wider than the pins of an integrated circuit (not shown).

Figure 7:
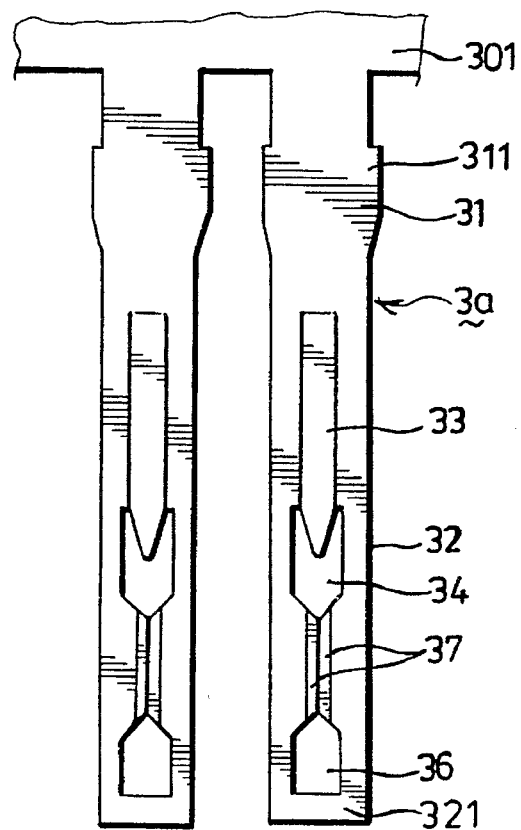
FIG. 7 is a fragmentary schematic view of a stamped metal sheet used in forming the conductive terminal pin shown in FIG. 6.
Figure 8:
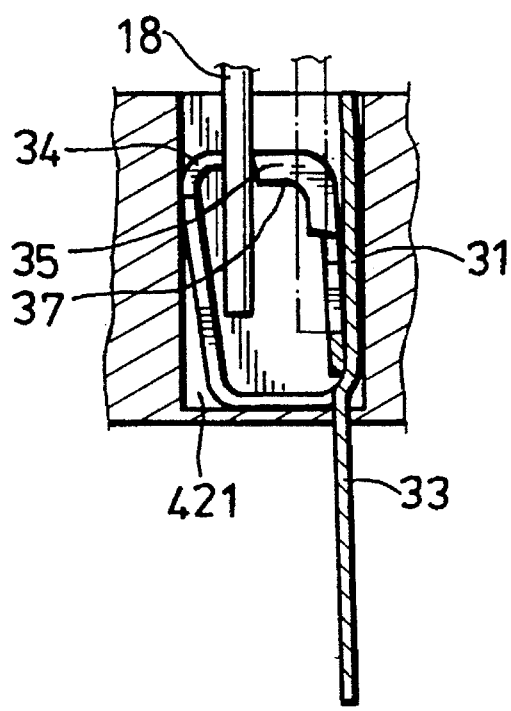
FIG. 8 is a sectional view illustrating how the conductive terminal pin of the first preferred embodiment retains a pin of an integrated circuit in a terminal hole of a base body of the integrated circuit socket assembly.
Figure 9:
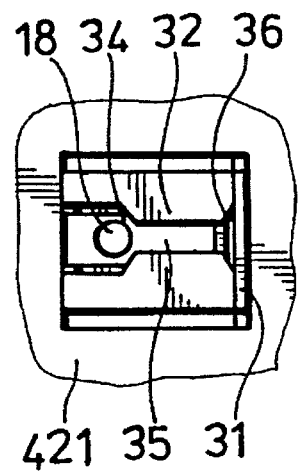
FIG. 9 is a top view illustrating how the conductive terminal pin of the first preferred embodiment retains the integrated circuit pin in the terminal hole of the base body.

FIG. 7 illustrates a stamped metal sheet used in mass-producing the conductive terminal pin 3 of the first preferred embodiment. As shown, a connecting belt 301 interconnects the distal top ends of the intermediate conductive terminal pins 3a. Since the width of the conductive terminal pins 3a prior to bending so as to form the finished conductive terminal pins 3 does not exceed the standard 2.54 mm distance between two adjacent pins of the CPU, the distance between two adjacent conductive terminal pins 3a can be set to about 2.54 mm. Thus, one row of terminal holes 421 in the base body 42 of the socket assembly can be filled with the conductive terminal pins 3 in a single mounting operation, as shown in FIG. 5. The connecting belt 301 is torn off once the conductive terminal pins 3 have been mounted in the base body 42. Referring to FIGS. 6, 8 and 9, the second segments 3202 of the contact arms 320 preferably incline in a direction away from the back portion 31. Thus, the upper part of the conductive terminal pin 3 tapers gradually in a direction toward the lower part 33. When the conductive terminal pin 3 is mounted in one of the terminal holes 421 of the base body 42, the second segments 3202 of the contact arms 320 and the back portion 31 abut tightly against opposite side walls which confine the respective terminal hole 421, and the fourth segment 3204 is pressed toward the back portion 31, thereby mounting securely the conductive terminal pin 3 in the terminal hole 421.

As shown in FIGS. 5, 8 and 9, when the pins 18 of an integrated circuit are extended into the terminal holes 421 of the base body 42, the pins 18 extend initially into the insert portion 34 of the pin receiving channel 30 of the respective conductive terminal pin 3. Since the conductive terminal pins 3 do not contact the pins 18 at this time, no resistance is encountered when the pins 18 are extended into the terminal holes 421. When the actuating lever 43 is operated so as to move the chip mounting plate 41 slidably on the base body 42, the pins 18 are moved toward the retaining portion 35 of the pin receiving channel 30 of the respective conductive terminal pin 3 to establish electrical connection therewith and to mount securely the integrated circuit to the base body 42. The presence of the notch 36 at the distal ends of the fourth segments 3204 of the contact arms 320 enhances resiliency of the latter.

Figure 11:
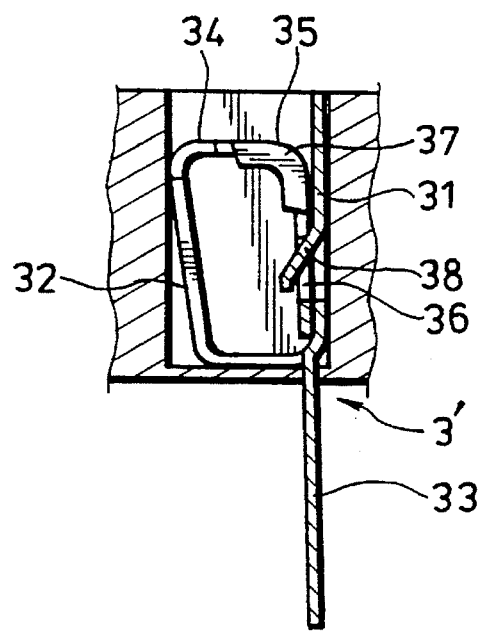
FIG. 11 is a sectional view illustrating the second preferred embodiment.

FIG. 10 illustrates a stamped metal sheet used in forming a conductive terminal pin of the second preferred embodiment of a zero insert-force integrated circuit socket assembly according to the present invention. The stamped metal sheet is substantially similar to that shown in FIG. 7, except that the back portion 31 of the intermediate conductive terminal pin 3b is formed with a tab 38. Referring to FIG. 11, the tab 38 of the conductive terminal pin 3' of the second preferred embodiment inclines downwardly in a direction away from the back portion 31 and extends into the notch 36.

Figure 12:
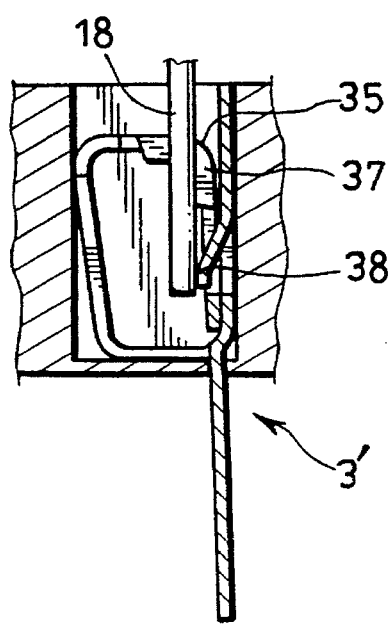
FIG. 12 is a sectional view illustrating how the conductive terminal pin of the second preferred embodiment retains a pin of an integrated circuit in a terminal hole of a base body of the integrated circuit socket assembly.

Referring to FIG. 12, when the pin 18 of an integrated circuit extends into the retaining portion 35 of the pin receiving channel 30 of the respective conductive terminal pin 3', the pin 18 is in contact with the clamping flanges 37 and the tab 38, thereby increasing the area of contact to enhance electrical connection with the conductive terminal pin 3'.

Figure 13:
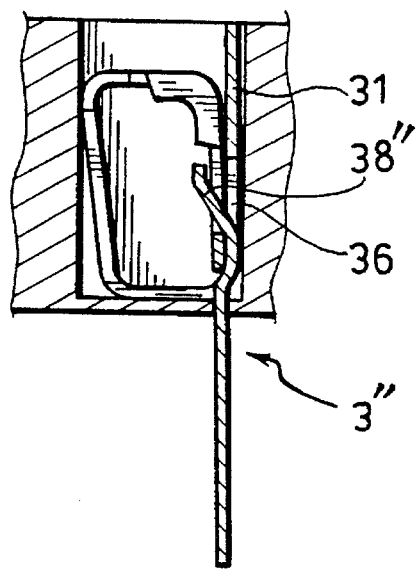
FIG. 13 is a sectional view illustrating the third preferred embodiment of a zero insert-force integrated circuit socket assembly according to the present invention.

FIG. 13 illustrates the conductive terminal pin 3" of the third preferred embodiment of a zero insert-force integrated circuit socket assembly according to the present invention. The conductive terminal pin 3" is substantially similar to the conductive terminal pin 3' of the second preferred embodiment. The tab 38" of the conductive terminal pin 3", however, inclines upwardly in a direction away from the back portion 31 and extends into the notch 36.

Figure 14:
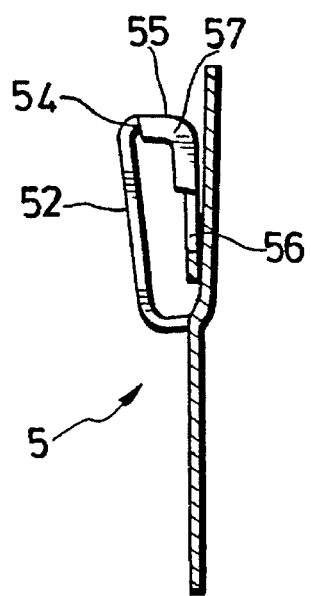
FIG. 14 is a sectional view of a conductive terminal pin for the fourth preferred embodiment of a zero insert-force integrated circuit socket assembly according to the present invention.

FIG. 14 illustrates the conductive terminal pin 5 of the fourth preferred embodiment of a zero insert-force integrated circuit socket assembly according to the present invention, while FIG. 15 illustrates a stamped metal sheet used in forming the conductive terminal pin 5. The integrated circuit socket assembly which uses the conductive terminal pin 5 is a high-density socket assembly that is adapted for use with a 320-pin CPU. As shown, the contact portion 52 of the conductive terminal pin 5 has a smaller width as compared to the contact portions 32 of the previous embodiments. In addition, the insert portion 54 of the pin receiving channel is narrower as compared to those of the previous embodiments. As with the previous embodiments, a notch 56 is formed at the distal end of the contact portion 52, the notch 56 being wider than the retaining portion 55 of the pin receiving channel. In addition, the contact portion 52 is formed with a pair of clamping flanges 57 on two sides of the retaining portion 55. In this embodiment, the width of the insert portion 54 is preferably about 0.6 mm, which is still wider than the standard 0.5 mm width of the pin of the CPU. The width of the retaining portion 55 is preferably about 0.35 to 0.4 mm, while the width of the notch 56 is about 0.7 mm.

Referring to FIG. 16, the terminal holes 62 in the base body of the socket assembly are generally T-shaped to optimize the number of terminal holes 62 in the base body, and have a maximum width of about 1.41 mm. The conductive terminal pins 5 have a back portion 51 with a maximum width of about 1.46 mm, which is slightly wider than the maximum width of the terminal holes 62, to mount securely the conductive terminal pins 5 in the terminal holes 62.

When the pins 19 of a high-density integrated circuit are extended into the terminal holes 62 of the base body, the pins 19 extend initially into the narrower portion of the terminal holes 62. Since the conductive terminal pins 5 do not contact the pins 19 at this time, no resistance is encountered when the pins 19 are extended into the terminal holes 62. When the actuating lever (not shown) is operated so as to move the chip mounting plate (not shown) slidably on the base body, the pins 19 are moved toward the retaining portion 55 of the pin receiving channel of the respective conductive terminal pin 5 to establish electrical connection therewith and to mount securely the integrated circuit to the base body. Of course, the conductive terminal pins 5 may be provided with a tab (not shown) similar to those of the second and third preferred embodiments to enhance electrical connection.

While the present invention has been described in connection with what is considered the most practical and preferred embodiments, it is understood that this invention is not limited to the disclosed embodiments, but is intended to cover various arrangements included within the spirit and scope of the broadest interpretation so as to encompass all such modifications and equivalent arrangements.

I claim:

1. A zero-insert force socket assembly for an integrated circuit, said socket assembly including a base body formed with a plurality of terminal holes, a plurality of conductive terminal pins received respectively in said terminal holes, a chip mounting plate mounted slidably on said base body and formed with a plurality of through-holes which permit extension of pins of the integrated circuit into a respective one of said terminal holes, and an actuating lever associated operably with said chip mounting plate and said base body and operable so as to move said chip mounting plate slidably on said base body to make or break electrical connection between the pins of the integrated circuit and said conductive terminal pins in said terminal holes, wherein:

each of said conductive terminal pins includes an upper part with a back portion and a curved contact portion, and a lower part that serves as a mounting leg, said contact portion including a pair of elongated contact arms that are connected spacedly to a bottom edge of said back portion, each of said contact arms having a first segment that extends substantially horizontally from said back portion, a second segment that extends upwardly from a distal end of said first segment, and a third segment that extends substantially horizontally from a distal end of said second segment toward said back portion, said contact arms defining therebetween a pin receiving channel with an insert portion that extends between a portion of said third segments of said contact arms adjacent to said second segments, and a retaining portion that extends between a portion of said third segments of said contact arms adjacent to said back portion, said insert portion being wider than the pins of the integrated circuit, said retaining portion being narrower than the pins of the integrated circuit, said lower part extending downwardly from said bottom edge of said back portion and being disposed between said contact arms.

2. The zero-insert force socket assembly as claimed in claim 1, wherein said back portion has an intermediate section which is slightly wider than said terminal holes in said base body to secure tightly said conductive terminal pins in said base body.

3. The zero-insert force socket assembly as claimed in claim 1, wherein each of said contact arms further has a fourth segment that extends downwardly from a distal end of said third segment, said retaining portion extending further between said fourth segments of said contact arms.

4. The zero-insert force socket assembly as claimed in claim 3, wherein said contact portion further includes a connecting strip that interconnects distal ends of said fourth segments of said contact arms.

5. The zero-insert force socket assembly as claimed in claim 4, wherein said connecting strip is formed with a notch that is wider than said retaining portion.

6. The zero-insert force socket assembly as claimed in claim 5, wherein said notch is wider than the pins of the integrated circuit.

7. The zero-insert force socket assembly as claimed in claim 5, wherein said back portion is formed with a tab that extends into said notch.

8. The zero-insert force socket assembly as claimed in claim 1, wherein said contact portion further includes a pair of clamping flanges formed respectively on said contact arms on two sides of said retaining portion.

9. The zero-insert force socket assembly as claimed in claim 1, wherein said second segments of said contact arms incline in a direction away from said back portion, said second segments of said contact arms and said back portion abutting tightly against opposite side walls which confine a respective one of said terminal holes, thereby mounting securely said conductive terminal pins in said terminal holes.

10. A conductive terminal pin for a zero-insert force integrated circuit socket assembly, the socket assembly including a base body formed with a plurality of terminal holes, a chip mounting plate mounted slidably on the base body and formed with a plurality of through-holes which permit extension of pins of an integrated circuit into a respective one of the terminal holes, and an actuating lever associated operably with the chip mounting plate and the base body and operable so as to move the chip mounting plate slidably on the base body, said conductive terminal pin to be received in a respective one of the terminal holes and comprising:

an upper part with a back portion and a curved contact portion, and a lower part that serves as a mounting leg, said contact portion including a pair of elongated contact arms that are connected spacedly to a bottom edge of said back portion, each of said contact arms having a first segment that extends substantially horizontally from said back portion, a second segment that extends upwardly from a distal end of said first segment, and a third segment that extends substantially horizontally from a distal end of said second segment toward said back portion, said contact arms defining therebetween a pin receiving channel with an insert portion that extends between a portion of said third segments of said contact arms adjacent to said second segments, and a retaining portion that extends between a portion of said third segments of said contact arms adjacent to said back portion, said insert portion being wider than the pins of the integrated circuit, said retaining portion being narrower than the pins of the integrated circuit, said lower part extending downwardly from said bottom edge of said back portion and being disposed between said contact arms.

11. The conductive terminal pin as claimed in claim 10, wherein said back portion has an intermediate section which is slightly wider than the terminal holes in the base body.

12. The conductive terminal pin as claimed in claim 10, wherein each of said contact arms further has a fourth segment that extends downwardly from a distal end of said third segment, said retaining portion extending further between said fourth segments of said contact arms.

13. The conductive terminal pin as claimed in claim 12, wherein said contact portion further includes a connecting strip that interconnects distal ends of said fourth segments of said contact arms.

14. The conductive terminal pin as claimed in claim 13, wherein said connecting strip is formed with a notch that is wider than said retaining portion.

15. The conductive terminal pin as claimed in claim 14, wherein said notch is wider than the pins of the integrated circuit.

16. The conductive terminal pin as claimed in claim 14, wherein said back portion is formed with a tab that extends into said notch.

17. The conductive terminal pin as claimed in claim 10, wherein said contact portion further includes a pair of clamping flanges formed respectively on said contact arms on two sides of said retaining portion.

18. The conductive terminal pin as claimed in claim 10, wherein said second segments of said contact arms incline in a direction away from said back portion, whereby, said second segments of said contact arms and said back portion abut tightly against opposite side walls which confine the respective one of the terminal holes when said conductive terminal pin is mounted in the respective one of the terminal holes.

* * * * *